United States Patent
Ramaswamy et al.

(10) Patent No.: US 10,699,784 B2
(45) Date of Patent: *Jun. 30, 2020

(54) RESISTIVE MEMORY SENSING

(71) Applicant: Micron Technology, Inc., Boise, ID (US)

(72) Inventors: D.V. Nirmal Ramaswamy, Boise, ID (US); Gurtej S. Sandhu, Boise, ID (US); Lei Bi, Sichuan (CN); Adam D. Johnson, Meridian, ID (US); Brent Keeth, Boise, ID (US); Alessandro Calderoni, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/057,170

(22) Filed: Aug. 7, 2018

(65) Prior Publication Data

US 2018/0342294 A1  Nov. 29, 2018

Related U.S. Application Data

(63) Continuation of application No. 14/719,053, filed on May 21, 2015, now Pat. No. 10,062,432, which is a continuation of application No. 13/921,951, filed on Jun. 19, 2013, now Pat. No. 9,058,875.

(60) Provisional application No. 61/738,062, filed on Dec. 17, 2012.

(51) Int. Cl.
*G11C 13/00* (2006.01)
*G11C 11/16* (2006.01)

(52) U.S. Cl.
CPC ........ *G11C 13/004* (2013.01); *G11C 11/1673* (2013.01); *G11C 13/0069* (2013.01); *G11C 2013/0047* (2013.01); *G11C 2013/0057* (2013.01)

(58) Field of Classification Search
None
See application file for complete search history.

(56) References Cited

U.S. PATENT DOCUMENTS

| | | |
|---|---|---|
| 6,185,143 B1 | 2/2001 | Perner et al. |
| 6,985,383 B2 | 1/2006 | Tang et al. |
| 7,755,923 B2 | 7/2010 | Liu et al. |
| 8,045,370 B2 | 10/2011 | Zhu et al. |
| 8,493,776 B1 | 7/2013 | Yu et al. |

(Continued)

OTHER PUBLICATIONS

Unknown, "Apparatuses and Methods for Reading and/or Programming Data in Memory Arrays Having Varying Available Storage Ranges," (22 pgs.).

*Primary Examiner* — James G Norman
(74) *Attorney, Agent, or Firm* — Brooks, Cameron & Huebsch, PLLC

(57) ABSTRACT

The present disclosure includes apparatuses and methods for sensing a resistive memory cell. A number of embodiments include performing a sensing operation on a memory cell to determine a current value associated with the memory cell, applying a programming signal to the memory cell, and determining a data state of the memory cell based on the current value associated with the memory cell before applying the programming signal and a current value associated with the memory cell after applying the programming signal.

20 Claims, 7 Drawing Sheets

(56) References Cited

U.S. PATENT DOCUMENTS

| | | | |
|---|---|---|---|
| 10,062,432 B2* | 8/2018 | Ramaswamy | G11C 13/004 |
| 2005/0073881 A1* | 4/2005 | Tran | G11C 11/16 |
| | | | 365/158 |
| 2005/0243598 A1* | 11/2005 | Lin | G11C 11/1673 |
| | | | 365/158 |
| 2010/0110760 A1 | 5/2010 | Chen et al. | |

* cited by examiner

RESISTIVE MEMORY SENSING

PRIORITY INFORMATION

This application is a Continuation of U.S. application Ser. No. 14/719,053, filed May 21, 2015, which is a Continuation of U.S. application Ser. No. 13/921,951, filed Jun. 19, 2013, which issued as U.S. Pat. No. 9,058,875 on Jun. 16, 2015, which claims the benefit of U.S. Provisional Application No. 61/738,062, filed Dec. 17, 2012, the contents of which are herein incorporated by reference.

TECHNICAL FIELD

The present disclosure relates generally to apparatuses, such as semiconductor memory devices, systems, and controllers, and related methods, and more particularly, to sensing resistive memory cells.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), resistive random access memory (RRAM), magnetoresistive random access memory (MRAM; also referred to as magnetic random access memory), and conductive-bridging random access memory (CBRAM), among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistive memory such as RRAM includes resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying a programming signal to the resistive memory cells. Programming signals can include applying sources of an electrical field or energy, such as positive or negative electrical pulses (e.g., positive or negative voltage or current pulses) to the cells (e.g., to the resistive memory element of the cells) for a particular duration.

A resistive memory cell can be programmed to one of a number of data states (e.g., resistance states). For example, a single level cell (SLC) may be programmed to one of two data states, a low resistance state that corresponds to a set data state (e.g., logic 1), or a high resistance state that corresponds to a reset data state (e.g., logic 0). The data state of the memory cell can depend on whether the cell is programmed to a resistance above or below a particular level. As an additional example, various resistive memory cells can be programmed to one of multiple different resistance states corresponding to multiple data states. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

In some instances, a sensing operation used to determine the data state of a resistive memory cell can incorrectly determine the data state of the resistive memory cell. For example, if the resistance associated with the memory cell corresponds to a reset data state when the memory cell has been programmed with a set programming pulse an incorrect data state may be determined. If the resistance of the memory cell corresponds to a set data state when the memory cell has been programmed with a reset programming pulse an incorrect data state may be determined.

DETAILED DESCRIPTION

Figure 1:
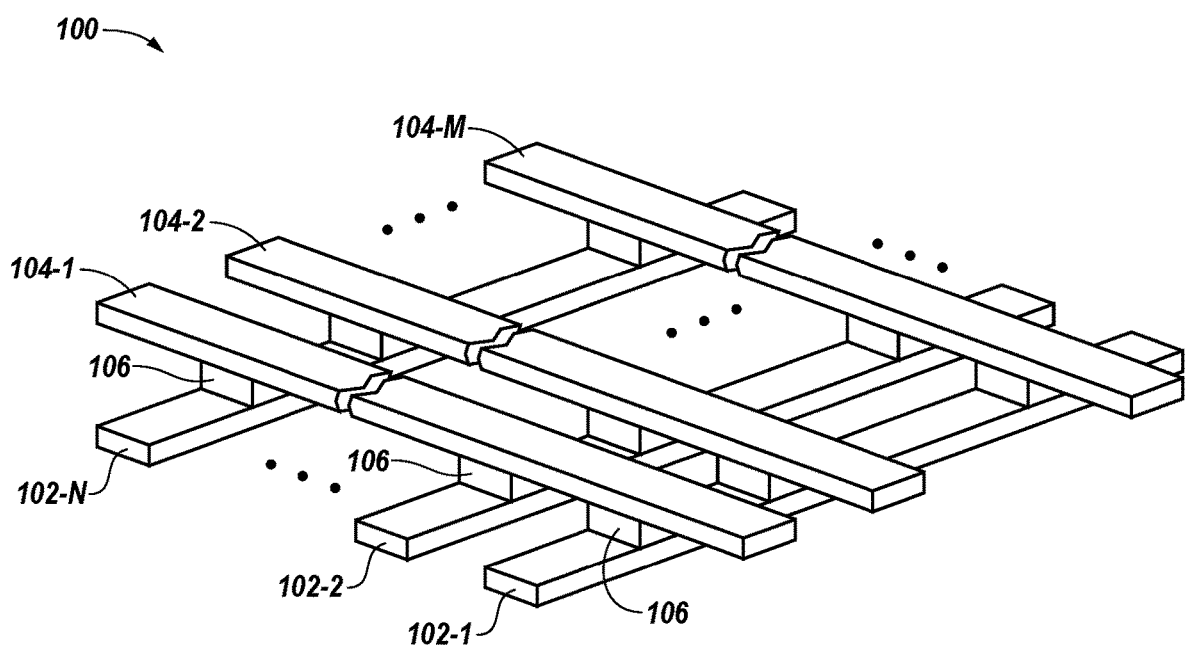
FIG. 1 is a block diagram of a portion of an array of resistive memory cells according to a number of embodiments of the present disclosure.

The present disclosure includes apparatuses and methods for sensing a resistive memory cell. A number of embodiments include performing a sensing operation on a memory cell to determine a current associated with the memory cell, applying a programming signal to the memory cell, and determining a data state of the memory cell based on the current associated with the memory cell before applying the programming signal and a current associated with the memory cell after applying the programming signal.

A sensing operation according to a number of embodiment of the present disclosure can reduce sensing errors associated with a cell having a resistance associated with a set data state, but having been programed with a reset programming signal and/or sensing errors associated with a cell having a resistance associated with a reset data state, but having been programmed with a set programming signal. In a number of embodiments, a method for sensing a resistive memory cell can include performing a sensing operation on a memory cell to determine a current associated with the memory cell, applying a programming signal to the memory cell, and performing another sensing operation on the memory cell to determine the current associated with the memory cell after applying the programming signal to the memory cell. The data state of the memory cell can be determined by comparing the current associated with the memory cell before applying the programming signal to the current associated with the memory cell after applying the programming signal.

In one embodiment, the data state of the memory cell corresponds to a data state other than a data state associated with the programming signal if the current associated with the memory cell before applying the programming signal is different than the current value associated with the memory cell after applying the programming signal by at least a threshold amount. In another embodiment, the data state of the memory cell corresponds to a data state associated with the programming signal if the current associated with the memory cell before applying the programming signal is different than the current associated with the memory cell after applying the programming signal by less than a threshold amount. In a number of embodiments, the threshold amount can correspond to the programming window of the memory cell. However, embodiments are not limited to this example.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things. For example, a number of memory devices can refer to one or more memory devices. As used herein, the designators "N" and "M", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 500 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a block diagram of a portion of an array 100 of resistive memory cells 106 according to a number of embodiments of the present disclosure. In the example illustrated in FIG. 1, array 100 is a cross-point array having resistive memory cells 106 located at the intersections of a first number of conductive lines 102-1, 102-2, . . . , 102-N (e.g., access lines, which may be referred to herein as word lines), and a second number of conductive lines 104-1, 104-2, . . . , 104-M (e.g., data/sense lines, which may be referred to herein as bit lines). As illustrated in FIG. 1, word lines 102-1, 102-2, . . . , 102-N are substantially parallel to each other and are substantially orthogonal to bit lines 104-1, 104-2, . . . , 104-M, which are substantially parallel to each other; however, embodiments are not so limited. In the embodiment illustrated in FIG. 1, resistive memory cells 106 can function in a two-terminal architecture (e.g., with a particular word line 102-1, 102-2, . . . , 102-N and bit line 104-1, 104-2, . . . , 104-M serving as a bottom and top electrode for the cell 106).

Each resistive memory cell 106 can include a storage element (e.g., a resistive memory element) coupled (e.g., in series) to a select device (e.g., an access device). The access device can be, for example, a diode or a transistor (e.g., a field effect transistor (FET) or bipolar junction transistor (BJT)), among others. The storage element can include a programmable portion that may have a variable resistance, for example. For instance, the storage element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistive memory cells 106 can include various materials employing trapped charges to modify or alter conductivity, chalcogenides formed of various doped or undoped materials, binary metal oxide materials, colossal magnetoresistive materials, and/or various polymer based resistive variable materials, among others. Embodiments are not limited to a particular resistance variable material or materials. As such, resistive memory cells 106 can be single level and/or multilevel resistive random access memory (RRAM) cells, programmable conductor memory cells, phase change random access memory (PCRAM) cells, magnetoresistive random access memory cells, and/or conductive-bridging random access memory (CBRAM) cells, among various other types of resistive memory cells.

In a number of embodiments, a forming process can be performed on the storage element of resistive memory cells 106 (e.g., to initiate the resistive switching property of the cell). The forming process can be referred to as an electroforming process, and can include formation of an initial conductive filament, which can serve as a switching mechanism for the cell (e.g., the filament can be used to switch the cell between a reset data state and a set data state). The filament can be formed of, for example, a number of metal precipitates and/or a number of oxygen vacancies.

In operation, resistive memory cells 106 of array 100 can be programmed via programming signals (e.g., write voltage and/or current pulses) applied to the cells (e.g., the storage element of the cells) via selected word lines 102-0, 102-1, . . . , 102-N and bit lines 104-0, 104-1, . . . , 104-M. The amplitude (e.g., magnitude), duration (e.g., width), and/or number of programming pulses, for example, applied to resistive memory cells 106 can be adjusted (e.g., varied) in order to program the cells to one of a number of different resistance states corresponding to particular data states.

In a number of embodiments, a single level resistive memory cell may be programmed to one of two data states (e.g., logic 1 or 0). The memory cell may be programmed with a set programming signal, which will place the cell in a low resistance state that corresponds to a set data state, e.g., logic 1, or the memory cell may be programmed with a reset programming signal, which will place the cell in a high resistance state that corresponds to a reset data state, e.g., logic 0. In a number of embodiments, the difference in resistance between the low resistance state and the high resistance state of a memory cell can be referred to as the programming window. For example, a memory cell in the high resistance state can have a resistance that is 10 times more that the resistance of the memory cell in the low resistance state, therefore the programming window for the memory cell can be 10 times the low resistance state. Embodiments in the present disclosure are not limited to a particular programming window and the programming window can include a number of differences in resistance between the high resistance state and the low resistance state.

A sensing (e.g., program verify and/or read) operation can be used to determine the data state of a resistive memory cell 106 (e.g., the resistance state of the storage element of a resistive memory cell 106) by a sensing (e.g., read) current, for example, on a bit line 104-0, 104-1, . . . , 104-M associated with the respective cell responsive to a particular voltage applied to the selected word line 102-0, 102-1, . . . , 102-N to which the selected cell is coupled. A sensing operation can incorrectly determine the data state of a resistive memory cell 106 when the resistance associated with the memory cell 106 during the sensing operation corresponds to a reset data state, e.g., high resistance state, when the memory cell has been programmed with a set programming pulse; or when the resistance associated with the memory cell 106 during the sensing operation corresponds to a set data state, e.g., low resistance state, when the memory cell has been programmed with a reset programming pulse.

A sensing operation according to a number of embodiments of the present disclosure can reduce sensing errors associated with a cell having a resistance associated with a set data state, but having been programed with a reset programming signal and/or sensing errors associated with a cell having a resistance associated with a reset data state, but having been programmed with a set programming signal. Also, a sensing operation according to a number of embodiments of the present disclosure can be used in response to an uncorrectable error correction code (ECC) error by determining if a cell having a resistance associated with a set data state has been programed with a reset programming signal and/or if a cell having a resistance associated with a reset data state has been programmed with a set programming signal. In a number of embodiments, a method for sensing a resistive memory cell can include performing a sensing operation on a memory cell to determine a current associated with the memory cell, applying a programming signal to the memory cell, and performing another sensing operation on the memory cell to determine the current associated with the memory cell after applying the programming signal to the memory cell. The data state of the memory cell can be determined by comparing the current associated with the memory cell before applying the programming signal to the current associated with the memory cell after applying the programming signal. In one embodiment, the data state of the memory cell corresponds to a state other than a data state associated with the programming signal if the current associated with the memory cell before applying the programming signal is different than the current associated with the memory cell after applying the programming signal by at least a threshold amount. In another embodiment, the data state of the memory cell corresponds to a state associated with programming signal if the current associated with the memory cell before applying the programming signal is different than the current associated with the memory cell after applying the programming signal by less than a threshold amount. In a number of embodiments, the threshold amount can correspond to the programming window of the memory cell and/or an amount of resistance change associated with a change in data state of memory cell.

In a number of embodiments, a ratio of the current associated with the memory cell after applying the programming signal and the current associated with the memory cell before applying the programming signal can be used to determine the data state of the memory cell. In one embodiment, if a ratio of the current associated with the memory cell after applying the programming signal and the current associated with the memory cell before applying the programming signal is at least (e.g., is equal to or greater than) a threshold amount, then the data state of the memory cell corresponds to a data state other than a data state associated with the programming signal. In another embodiment, if a ratio of the current associated with the memory cell after applying the programming signal and the current associated with the memory cell before applying the programming signal is less than a threshold amount, then the data state of the memory cell corresponds to a data state associated with the programming signal.

Figure 2A:
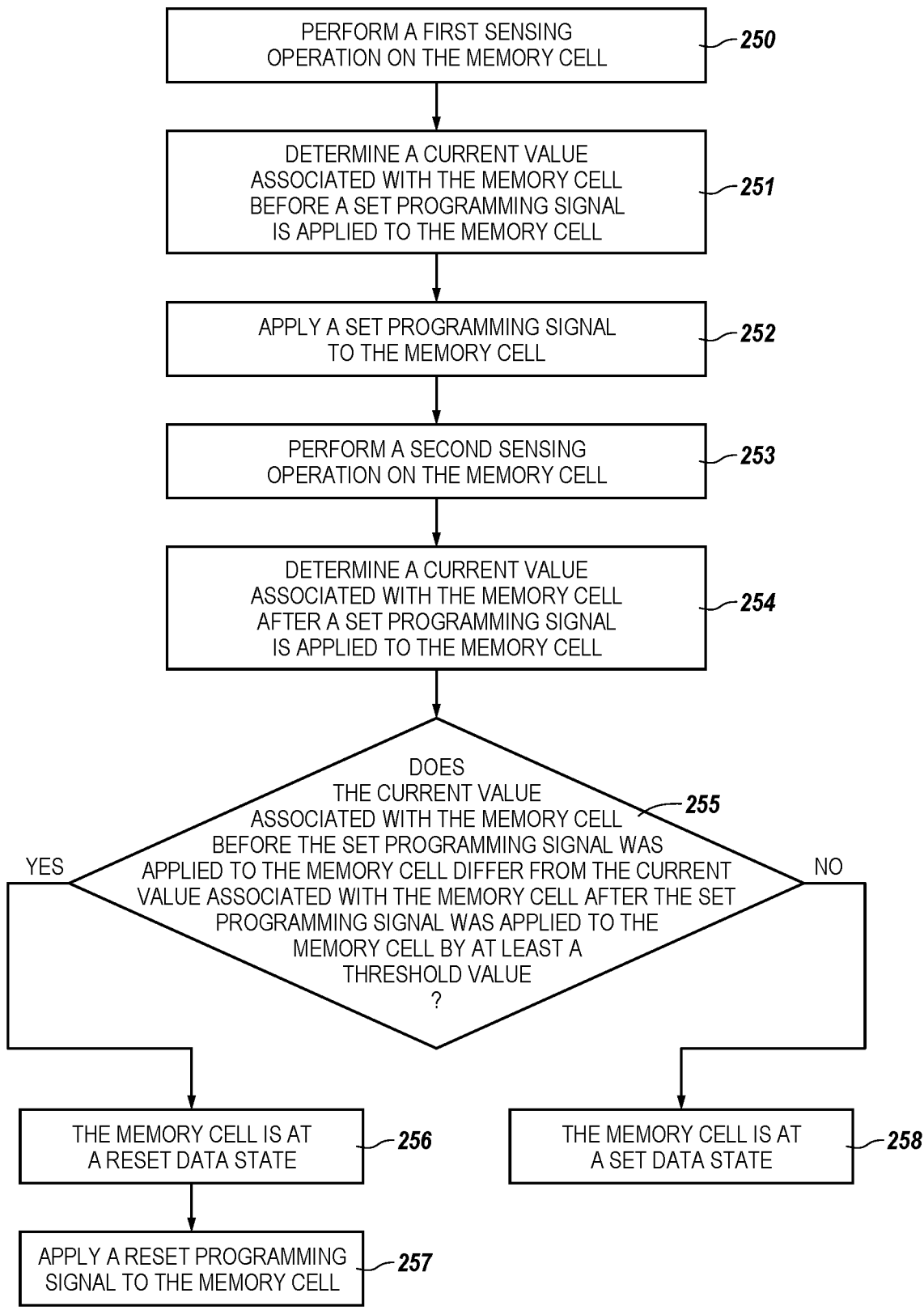
FIGS. 2A and 2B illustrate methods for determining a data state of resistive memory cells according to a number of embodiments of the present disclosure.
Figure 2B:
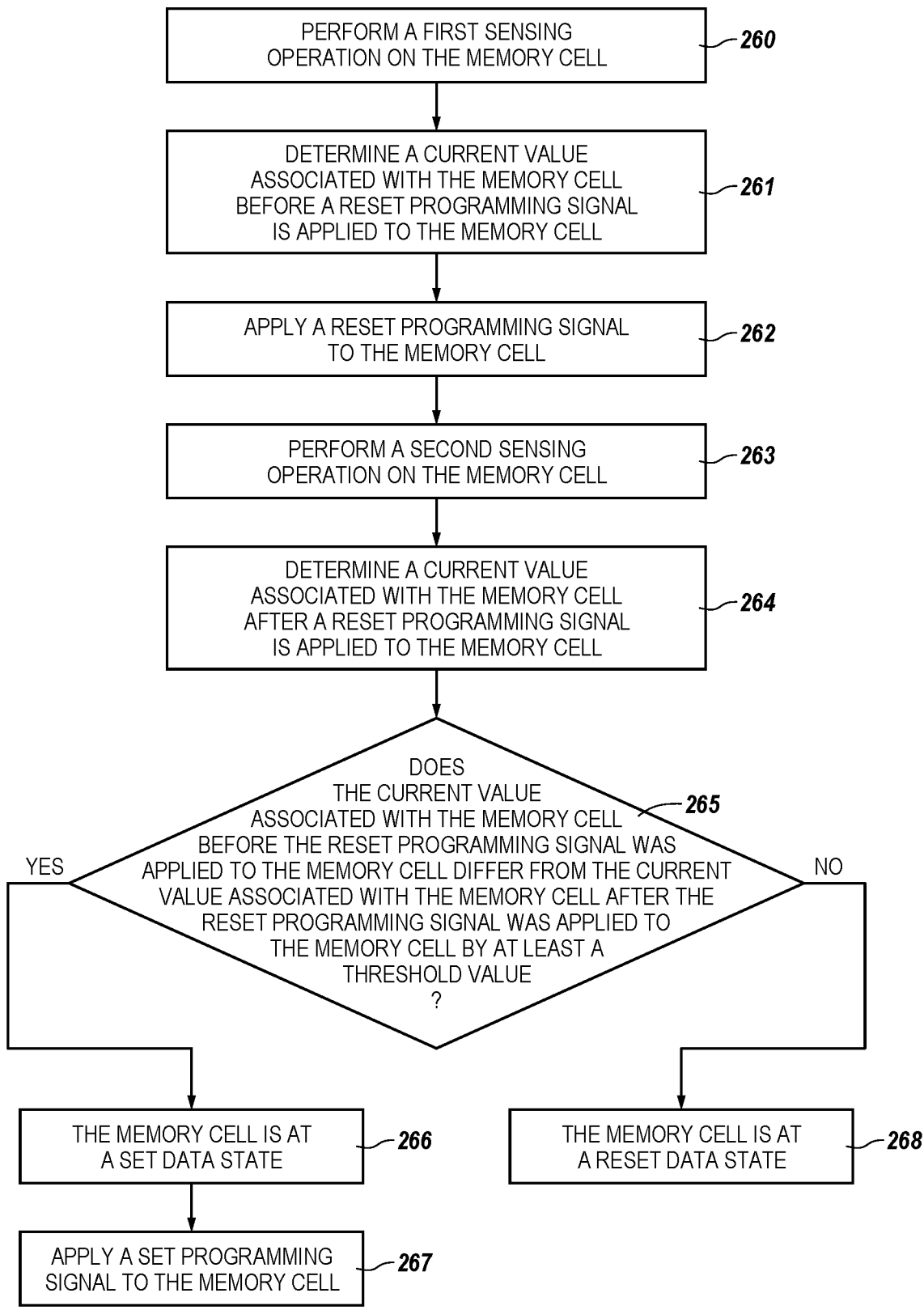

FIGS. 2A and 2B illustrate methods for determining a data state of resistive memory cells according to a number of embodiments of the present disclosure. In FIG. 2A, the method for determining a data state of a resistive memory cell includes using a set programming signal and currents associated with the memory cell before and after the set programming signal is applied to the resistive memory cell for determining a data state of the resistive memory cell. The method of FIG. 2A includes performing a first sensing operation on the memory cell 250 and determining a current associated with the memory cell before a set programming signal is applied to the memory cell 251. The method then includes applying a set programming signal to the memory cell 252, performing a second sensing operation on the memory cell 253, and determining a current associated with the memory cell after a set programming signal is applied the memory cell 254. Once the currents associated with the memory cell before and after the set programming signal was applied to the memory cell have been determined, the method includes determining if the current associated with the memory cell before the set programming signal was applied to the memory cell differs from the current associated with the memory cell after the set programming signal was applied to the memory cell by at least a threshold amount 255. If the current associated with the memory cell before the set programming signal was applied to the memory cell differs from the current associated with the memory cell after the set programming signal was applied to the memory cell by at least a threshold amount, the memory cell was at a reset data state 256. A reset programming signal can be applied to the memory cell 257 to properly program the cell to the reset data state. If the current associated with the memory cell before the set programming signal was applied to the memory cell does not differ from the current associated with the memory cell after the set programming signal was applied to the memory cell by at least a threshold amount, the memory cell is at a set data state 258.

In FIG. 2B, the method for determining a data state of a resistive memory cell includes using a reset programming signal and currents associated with the memory cell before and after the reset programming signal is applied to the resistive memory cell for determining a data state of the resistive memory cell. The method of FIG. 2B includes performing a first sensing operation on the memory cell 260 and determining a current associated with the memory cell before a reset programming signal is applied to the memory cell 261. The method then includes applying a reset programming signal to the memory cell 262, performing a second sensing operation on the memory cell 263, and determining a current associated with the memory cell after a reset programming signal is applied the memory cell 264. Once the currents associated with the memory cell before and after the reset programming signal was applied to the memory cell have been determined, the method includes determining if the current associated with the memory cell before the reset programming signal was applied to the memory cell differs from the current associated with the memory cell after the reset programming signal was applied to the memory cell by at least a threshold amount 265. If the current associated with the memory cell before the reset programming signal was applied to the memory cell differs from the current associated with the memory cell after the reset programming signal was applied to the memory cell by at least a threshold amount, the memory cell was at a set data state 266. A set programming signal can be applied to the memory cell 267 to properly program the cell to the set data state. If the current associated with the memory cell before the reset programming signal was applied to the memory cell does not differ from the current associated with the memory cell after the reset programming signal was applied to the memory cell by at least a threshold amount, the memory cell is at a reset data state 268.

Figure 3A:
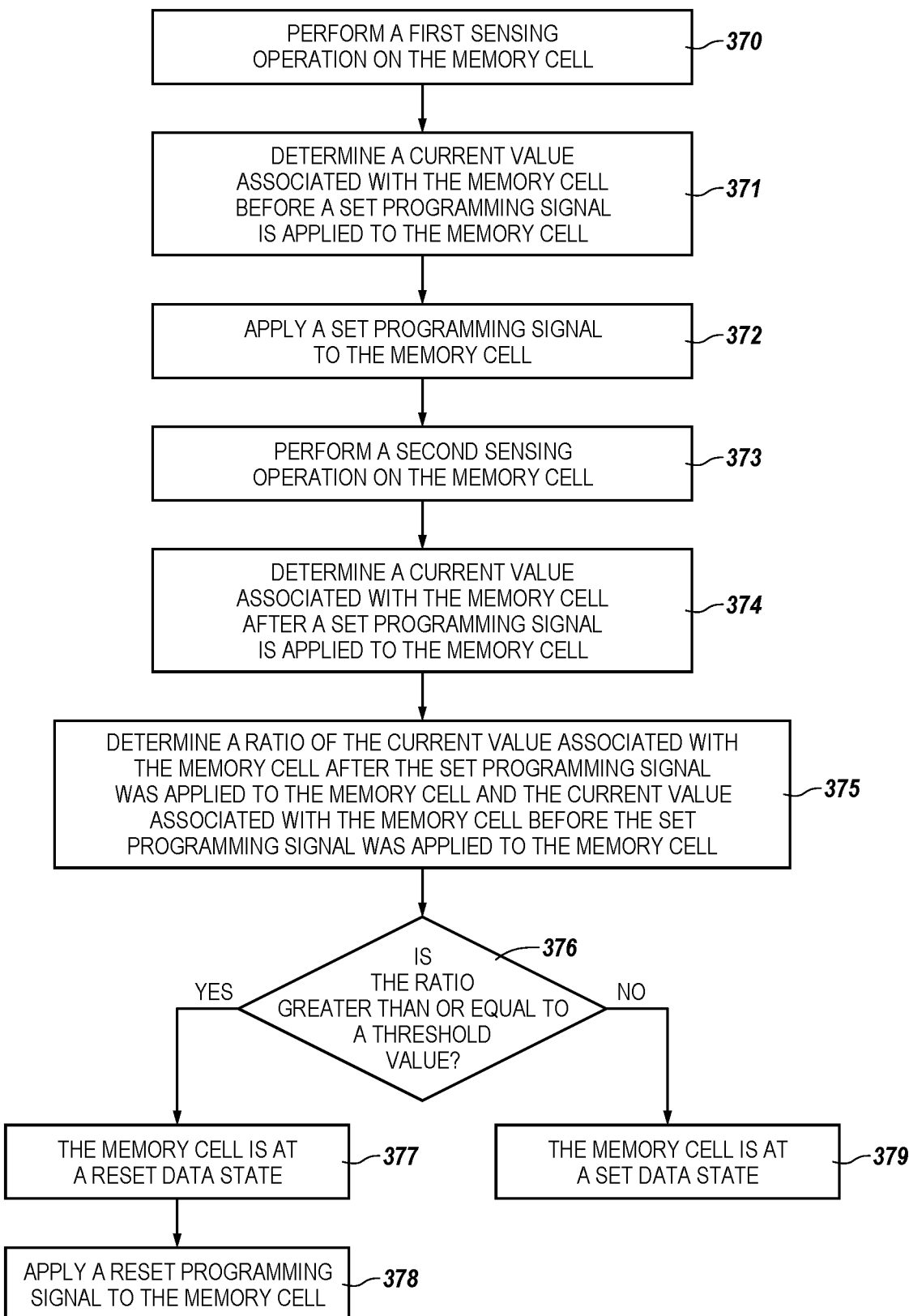
FIGS. 3A and 3B illustrate methods for determining a data state of resistive memory cells according to a number of embodiments of the present disclosure.
Figure 3B:
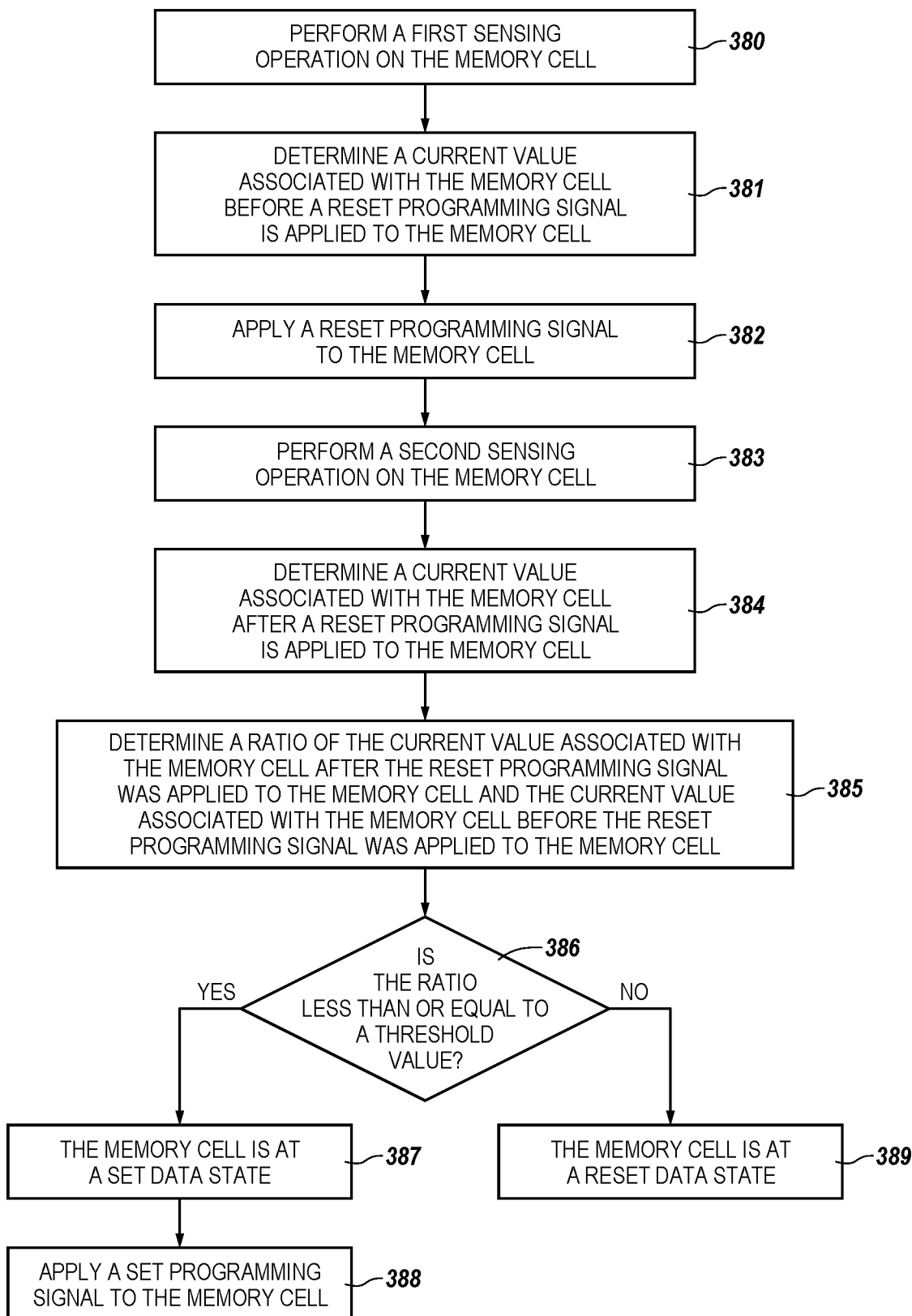

FIGS. 3A and 3B illustrate methods for determining a data state of resistive memory cells according to a number of embodiments of the present disclosure. In FIG. 3A, the method for determining a data state of a resistive memory cell includes using a set programming signal and a ratio of a current value associated with the memory cell after the set programming signal is applied to the resistive memory cell and a current associated with the memory cell before the set programming signal is applied to the resistive memory cell. The method of FIG. 3A includes performing a first sensing operation on the memory cell 370 and determining a current associated with the memory cell before a set programming signal is applied to the memory cell 371. The method then includes applying a set programming signal to the memory cell 372, performing a second sensing operation on the memory cell 373, and determining a current associated with the memory cell after a set programming signal is applied the memory cell 374. Once the currents associated with the memory cell before and after the set programming signal was applied to the memory cell have been determined, the method includes determining a ratio of the current associated with the memory cell after the set programming signal was applied to the memory cell and the current associated with the memory cell before the set programming signal was applied to the memory cell 375. If the ratio is at least a threshold amount 376, the memory cell was at a reset data state 377. A reset programming signal can be applied to the memory cell 378 to properly program the cell to the reset data state. If the ratio is not greater than or equal to a threshold amount, the memory cell is at a set data state 379.

In FIG. 3B, the method for determining a data state of a resistive memory cell includes using a reset programming signal and a ratio of a current associated with the memory cell after the reset programming signal is applied to the resistive memory cell and a current associated with the memory cell before the reset programming signal is applied to the resistive memory cell. The method of FIG. 3B includes performing a first sensing operation on the memory cell 380 and determining a current associated with the memory cell before a reset programming signal is applied to the memory cell 381. The method then includes applying a reset programming signal to the memory cell 382, performing a second sensing operation on the memory cell 383, and determining a current associated with the memory cell after a reset programming signal is applied the memory cell 384. Once the currents associated with the memory cell before and after the reset programming signal was applied to the memory cell have been determined, the method includes determining a ratio of the current associated with the memory cell after the reset programming signal was applied to the memory cell and the current associated with the memory cell before the reset programming signal was applied to the memory cell 385. If the ratio is less than to a threshold amount 386, the memory cell was at a set data state 387. A set programming signal can be applied to the memory cell 388 to properly program the cell to the set data state. If the ratio is not less than a threshold amount, the memory cell is at a reset data state 389.

Figure 4:
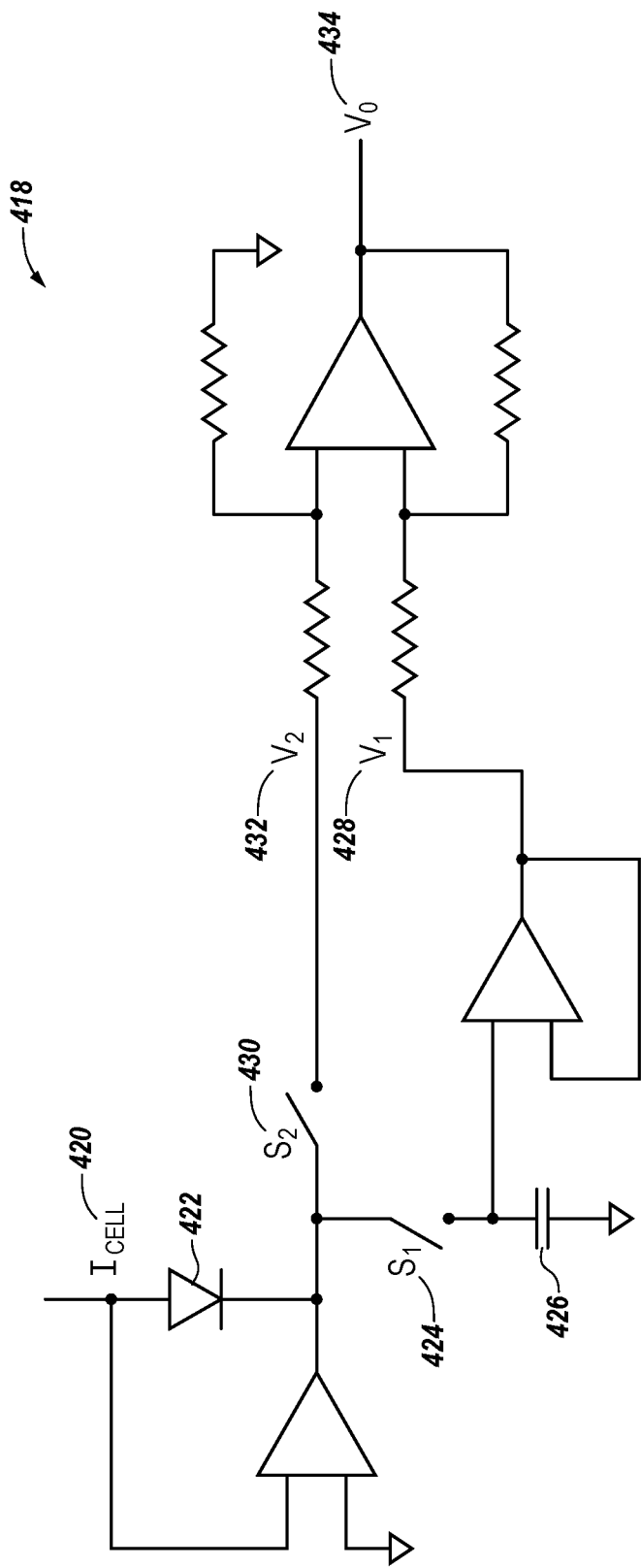
FIG. 4 illustrates circuitry for determining a ratio of currents associated with resistive memory cells according to a number of embodiments of the present disclosure.

FIG. 4 illustrates circuitry 418 for determining a ratio of currents associated with resistive memory cells according to a number of embodiments of the present disclosure. In FIG. 4, a current 420, $I_{cell}$, associated with a cell is applied to diode 422 to convert the current 420 associated with a cell to a voltage, e.g. $V_1$ 428 or $V_2$ 432. In one example, a current 420 associated with a memory cell before a programming signal is applied to the memory cell is applied to diode 422 to convert the current 420 to voltage $V_1$ 428. Switch ($S_1$) 424 is activated and the voltage $V_1$ 428 is sampled on capacitor 426. Then a programming signal is applied to the memory cell and a current 420 associated with a memory cell after the programming signal is applied to the memory cell is applied to diode 422 to convert the current 420 to voltage $V_2$ 432. Switch ($S_2$) 430 is activated and the voltage $V_2$ 432 is passed through the circuitry to produce output voltage $V_O$ 434, which corresponds to the ratio of the current associated with the memory cell after the programming signal is applied to the memory cell and the current associated with the memory cell before the programming signal was applied to the memory cell. The output voltage $V_O$ 434 can be compared to a threshold amount using a comparator to determine the data state of the memory cell.

Figure 5:
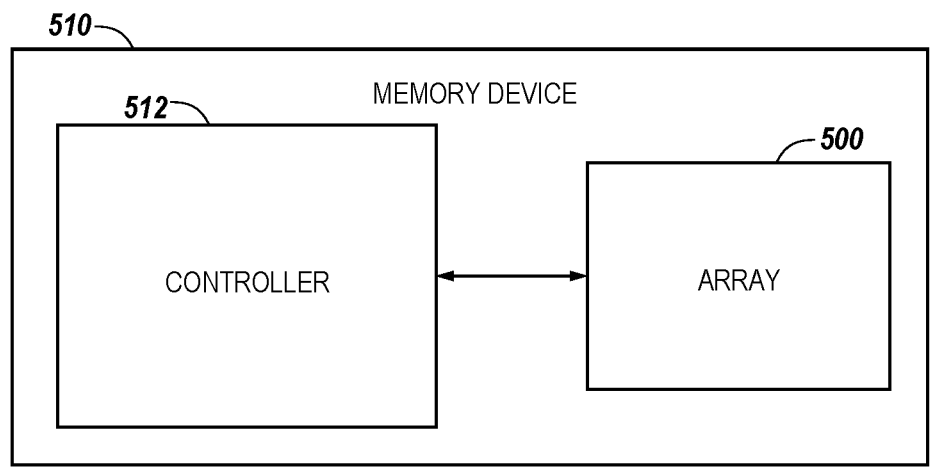
FIG. 5 illustrates a block diagram of an apparatus in the form of a memory device according to a number of embodiments of the present disclosure.

In a number of embodiments, the circuitry illustrated in FIG. 4 can be included in a controller, such as controller 512 described in FIG. 5. Embodiments of the present disclosure are not limited to the circuitry illustrated in FIG. 4.

FIG. 5 illustrates a block diagram of an apparatus in the form of a memory device 510 according to a number of embodiments of the present disclosure. As shown in FIG. 6, memory device 510 includes a controller 512 coupled to a memory array 500. As used herein, a memory system, a controller, or a memory device might also be separately considered an "apparatus." An "apparatus" can refer to, but is not limited to, any of a variety of structures or combinations of structures, such as a circuit or circuitry, a die or dice, a module or modules, a device or devices, or a system or systems, for example.

Memory array 500 can be analogous to, for example, memory array 100 previously described in connection with FIG. 1. Although one memory array is shown in FIG. 5, embodiments of the present disclosure are not so limited (e.g., memory device 510 can include more than one memory array coupled to controller 512).

Controller 512 can include, for example, control circuitry and/or firmware. Controller 512 can be included on the same physical device (e.g., the same die) as memory array 500, or can be included on a separate physical device that is communicatively coupled to the physical device that includes memory array 500. For example, controller 512 can be a controller of an array testing apparatus (e.g., a controller used to perform testing operations on memory arrays such as array 500).

Controller 512 can apply a number of signals in accordance with a number of embodiments of the present disclosure to the memory cells (e.g., to the storage elements of the memory cells) in memory array 500. For example, controller 512 can apply a programming signal such as a set programming signal and/or a reset programming signal previously described in connection with FIG. 1 to the storage element of the memory cells in memory array 500.

The embodiment illustrated in FIG. 5 can include additional circuitry that is not illustrated so as not to obscure embodiments of the present disclosure. For example, memory device 510 can include address circuitry to latch address signals provided over I/O connectors through I/O circuitry. Address signals can be received and decoded by a row decoder and a column decoder, to access memory array 500. As an additional example, memory device 510 can include sense (e.g., read) circuitry.

CONCLUSION

The present disclosure includes apparatuses and methods for sensing a resistive memory cell. A number of embodiments include performing a sensing operation on a memory cell to determine a current associated with the memory cell, applying a programming signal to the memory cell, and determining a data state of the memory cell based on the current associated with the memory cell before applying the programming signal and a current associated with the memory cell after applying the programming signal.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for sensing a memory cell, comprising:
performing a sensing operation on a memory cell to determine a first voltage associated with the memory cell;
activating a first switch and passing the first voltage through the first switch to sample the first voltage onto a comparator;
applying a programming signal to the memory cell, wherein the programming signal is a signal applied to program the memory cell to a particular data state associated with the programming signal;
activating a second switch and passing a second voltage associated with applying the programming signal through the second switch onto the comparator;
determining a data state of the memory cell based on an output signal from the comparator that is indicative of a ratio of the first voltage and the second voltage.

2. The method of claim 1, wherein the method includes performing another sensing operation on the memory cell to determine the second voltage associated with the memory cell after applying the programming signal to the memory cell.

3. The method of claim 1, wherein determining the data state of the memory cell includes the data state of the memory cell corresponds to a data state other than a data state associated with the programming signal if the first voltage associated with the memory cell before applying the programming signal is different than the second voltage associated with the memory cell after applying the programming signal by at least a threshold amount.

4. The method of claim 1, wherein determining the data state of the memory cell includes the data state of the memory cell corresponds to a data state associated with the programming signal if the first voltage associated with the memory cell before applying the programming signal is different than the second voltage associated with the memory cell after applying the programming signal by less than a threshold amount.

5. The method of claim 1, wherein determining the data state of the memory cell includes determining the data state corresponds to a data state other than a data state associated with the programming signal if a ratio of the first voltage associated with the memory cell after applying the programming signal and the second voltage associated with the memory cell before applying the programming signal is at least a threshold amount.

6. The method of claim 1, wherein determining the data state of the memory cell includes determining the data state of the memory cell corresponds to a data state the programming signal if a ratio of the first voltage associated with the memory cell after applying the programming signal and the second voltage associated with the memory cell before applying the programming signal is less than a threshold amount.

7. The method of claim 1, wherein the method includes determining the data state of the memory cell via a controller.

8. A method for sensing a memory cell, comprising:
performing a sensing operation on a memory cell to determine a current associated with the memory cell;
converting the current associated with the memory cell to a first voltage;
activating a first switch and passing the first voltage through the first switch to sample the first voltage onto a comparator;

applying a programming signal to the memory cell, wherein the programming signal is a signal applied to program the memory cell to a particular data state associated with the programming signal;

performing another sensing operation on the memory cell to determine a current associated with the memory cell after applying the set programming signal to the memory cell;

converting the current associated with the memory cell after applying the set programming signal to a second voltage;

activating a second switch and passing the second voltage through the second switch to sample the second voltage onto the comparator; and determining the data state of the memory cell based on an output signal from the comparator that is indicative of a ratio of the first voltage and the second voltage.

9. The method of claim 8, wherein:

the programming signal is a set programming signal;

determining the data state of the memory cell includes determining the memory cell is at a reset data state if the current value associated with the memory cell before applying the set programming signal is different than the current associated with the memory cell after applying the set programming signal by at least a threshold amount; and determining the data state of the memory cell includes determining the memory cell is at a set data state if the current value associated with the memory cell before applying the set programming signal is different than the current associated with the memory cell after applying the set programming signal by less than a threshold amount.

10. The method of claim 8, wherein the method includes applying a reset programming signal to the memory cell if the current associated with the memory cell before applying the set programming signal is different than the current associated with the memory cell after applying the set programming signal by at least a threshold amount.

11. The method of claim 8, wherein determining the data state of the memory cell includes determining whether the current associated with the memory cell after applying the set programming signal is at least 10 times larger than the current associated with the memory cell before applying the set programming signal.

12. The method of claim 8, wherein:

the programming signal is a reset programming signal;

determining the data state of the memory cell includes determining the memory cell is at a set data state if the current associated with the memory cell before applying the reset programming signal is different than the current associated with the memory cell after applying the reset programming signal by at least a threshold amount; and determining the data state of the memory cell includes determining the memory cell is at a reset data state if the current associated with the memory cell before applying the reset programming signal is different than the current associated with the memory cell after applying the reset programming signal by less than a threshold amount.

13. The method of claim 12, wherein the method includes applying a set programming signal to the memory cell if the current associated with the memory cell before applying the reset programming signal is different than the current associated with the memory cell after applying the reset programming signal by at least a threshold amount.

14. The method of claim 12, wherein determining the data state of the memory cell includes determining whether the current associated with the memory cell after applying the reset programming signal is at least 10 times smaller than the current associated with the memory cell before applying the reset programming signal.

15. An apparatus, comprising:

an array of memory cells; and a controller coupled to the array and configured to:
cause a first voltage corresponding to a current associated with performing a sensing operation on a memory cell to pass through a first switch and be stored in a capacitor coupled to a comparator;
cause a second voltage corresponding to a current associated with applying a programming signal to the memory cell to pass through a second switch and be sampled onto the comparator; and
determine a data state of a memory cell based on an output signal from the comparator that is indicative of a ratio of the first voltage and the second voltage.

16. The apparatus of claim 15, wherein the programming signal is a set programming signal and wherein the controller is configured to perform a first sensing operation before the set programming signal is applied to the memory cell and to perform a second sensing operation after the set programming signal is applied to the memory cell.

17. The apparatus of claim 16, wherein:

the controller is configured to determine that the memory cell is at a reset data state if the current associated with the memory cell before applying the set programming signal is different than the current associated with the memory cell after applying the set programming signal by at least a threshold amount; and the controller is configured to determine that the memory cell is at a set data state if the current associated with the memory cell before applying the set programming signal is different than the current associated with the memory cell after applying the set programming signal by less than a threshold amount.

18. The apparatus of claim 15, wherein the programming signal is a reset programming signal and wherein the controller is configured to perform a first sensing operation before the reset programming signal is applied to the memory cell and to perform a second sensing operation after the reset programming signal is applied to the memory cell.

19. The apparatus of claim 18, wherein the controller is configured to determine that the memory cell is at a set data state if the current associated with the memory cell before applying the reset programming signal is different than the current associated with the memory cell after applying the reset programming signal by at least a threshold amount.

20. The apparatus of claim 18, wherein the controller is configured to determine that the memory cell is at a reset data state if the current associated with the memory cell before applying the reset programming signal is different than the current associated with the memory cell after applying the reset programming signal by less than a threshold amount.

* * * * *